United States Patent
Balakrishnan et al.

(10) Patent No.: US 10,277,202 B2
(45) Date of Patent: Apr. 30, 2019

(54) METHODS AND APPARATUS FOR EFFICIENT LINEAR COMBINER

(71) Applicant: Texas Instruments Incorporated, Dallas, TX (US)

(72) Inventors: Jaiganesh Balakrishnan, Bangalore (IN); Sthanunathan Ramakrishnan, Bangalore (IN); Pooja Sundar, Bangalore (IN); Sashidharan Venkatraman, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/645,647

(22) Filed: Jul. 10, 2017

(65) Prior Publication Data

US 2018/0019732 A1 Jan. 18, 2018

(30) Foreign Application Priority Data

Jul. 14, 2016 (IN) .............................. 201641024045

(51) Int. Cl.
| | |
|---|---|
| *H03H 17/02* | (2006.01) |
| *H03H 17/00* | (2006.01) |
| *G06F 5/01* | (2006.01) |
| *G06F 7/544* | (2006.01) |
| *H03H 17/06* | (2006.01) |
| *H03M 1/06* | (2006.01) |
| *H03M 1/12* | (2006.01) |

(52) U.S. Cl.
CPC .......... *H03H 17/0219* (2013.01); *G06F 5/01* (2013.01); *G06F 7/5443* (2013.01); *H03H 17/0045* (2013.01); *H03H 17/06* (2013.01); *H03M 1/0626* (2013.01); *H03M 1/12* (2013.01); *H03M 1/1215* (2013.01)

(58) Field of Classification Search
CPC .......... H03H 17/0219; H03H 17/0045; H03H 17/06; H03H 1/0626; G06F 5/01; G06F 7/5443
USPC ................................ 708/317, 319, 620–632
See application file for complete search history.

(56) References Cited

U.S. PATENT DOCUMENTS

| | | | | |
|---|---|---|---|---|
| 4,615,026 A | * | 9/1986 | Schiff | H03H 17/06 708/319 |
| 5,222,035 A | * | 6/1993 | Nakase | H03H 17/0286 348/607 |
| 6,523,055 B1 | * | 2/2003 | Yu | G06F 7/5443 708/603 |

(Continued)

*Primary Examiner* — Tan V Mai
(74) *Attorney, Agent, or Firm* — John R. Pessetto; Charles A. Brill; Frank D. Cimino

(57) ABSTRACT

In accordance with an example, an integrated circuit includes a linear combiner having an input for receiving a signal. The linear combiner also has a plurality of operator circuits for applying weighting factors to the signal, in which a first operator circuit in the plurality of operator circuits performs a first operation on the signal using a first sub-weight of one of the weighting factors to provide a first tile output and a second operator circuit in the plurality of operator circuits performs a second operation on the signal using a second sub-weight of the one of the weighting factors to provide a second tile output. The linear combiner also has an adder having a first input coupled to receive the first tile output and the second tile outputs and providing a combined output.

19 Claims, 8 Drawing Sheets

(56) References Cited

U.S. PATENT DOCUMENTS 7,916,050 B1    3/2011   Mujica et al.
7,916,051 B1    3/2011   Sestok et al.

* cited by examiner

METHODS AND APPARATUS FOR EFFICIENT LINEAR COMBINER

CROSS-REFERENCE TO RELATED APPLICATIONS

This application claims the benefit under 35 U.S.C. § 119(a) to co-owned Indian Provisional Patent Application No. 201641024045, filed Jul. 14, 2016, which is hereby fully incorporated herein by reference.

TECHNICAL FIELD

This application relates generally to linear combination of signals.

BACKGROUND

Linear combiners, such as digital filters, have many uses in signal processing. One of those uses is with RF sampling receivers. RF sampling receivers convert an analog RF signal directly to a digital signal, thereby eliminating RF local oscillators (LO), mixers, gain stages and filters. A wide range of applications use this type of receiver including 3G/4G base station receivers, software-defined radio (SDR) and high performance test equipment.

RF sampling typically uses an interleaved analog-to-digital converter (ADC). For example, a device may use 4 ADCs sampling alternately at 750 million samples per second (MSPS) to realize a 3 billion (giga-) samples per second (GSPS) ADC. That is, while one ADC is latching an input, the other three ADCs are processing their inputs. Thus, the four ADCs process four inputs for each period and the combined throughput is 4×750 MSPS or 3 GSPS.

However, it is difficult to perfectly match ADCs. A typical mismatch is a difference in gain and phase at different frequencies. An interleaving (IL) mismatch corrector can correct spurs caused by IL mismatches. Examples of mismatch correctors can be found in co-owned U.S. Pat. Nos. 7,916,051 and 7,915,050, which are hereby fully incorporated herein by reference. The mismatches are typically frequency dependent and need a linear corrector or filter of many coefficients or "taps." For example, a 3 GSPS ADC using a 750MSPS ADCs typically will use a filter of 32 taps for each component ADC.

However, many applications for linear combiners, such as digital filters, must have very low power consumption. The large number of taps and the complex mathematical functions implemented by the combiners make this difficult to achieve.

SUMMARY

In accordance with an example, an integrated circuit includes a linear combiner having an input for receiving a signal. The linear combiner also has a plurality of operator circuits for applying weighting factors to the signal, in which a first operator in the plurality of operator circuits performs a first operation on the signal using a first sub-weight of one of the weighting factors to provide a first tile output and a second operator circuit in the plurality of operator circuits performs a second operation on the signal using a second sub-weight of the one of the weighting factors to provide a second tile output. The linear combiner also has an adder having a first input coupled to receive the first tile output and the second tile outputs and providing a combined output.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled." The term "plurality" as used herein means two or more.

Figure 1:
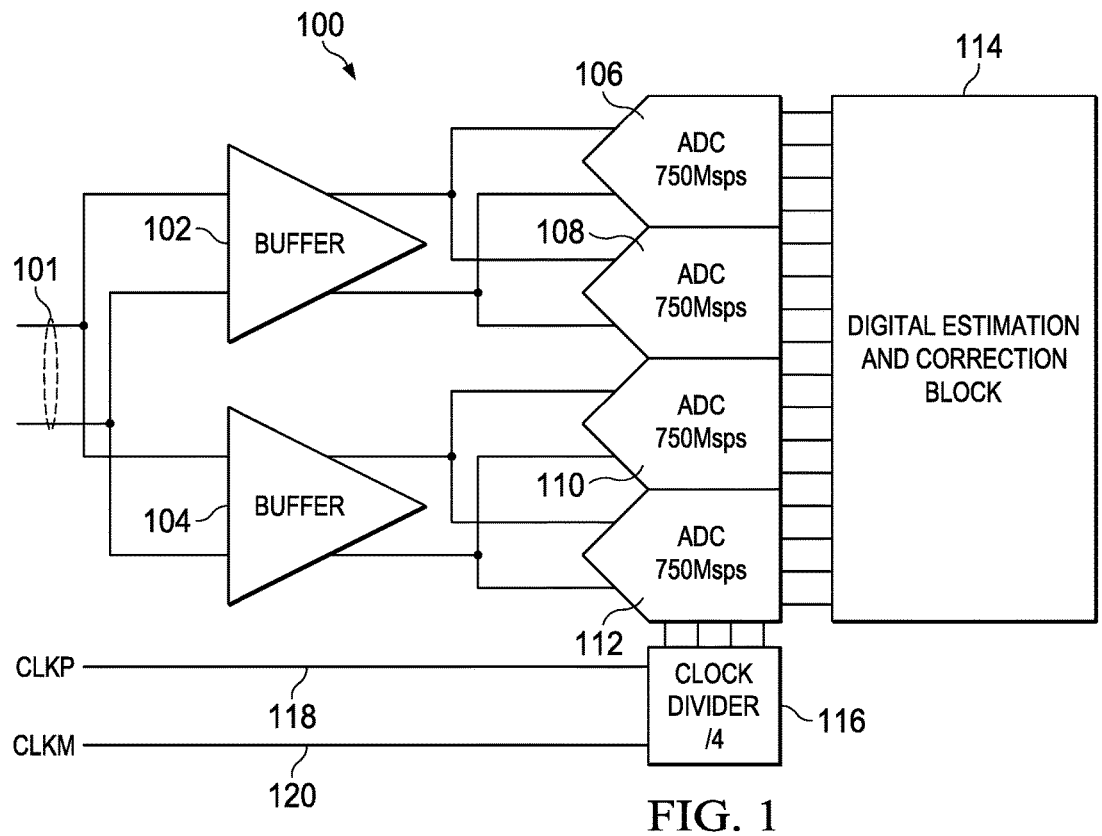
FIG. 1 is a block diagram of a high throughput analog to digital converter (ADC).

FIG. 1 is a block diagram of a high throughput analog to digital converter (ADC) 100. Differential inputs 101 feed buffers 102 and 104. Each of ADCs 106, 108, 110 and 112 has a throughput of 750 million samples per second (MSPS). Therefore, the combined throughput is 3 giga-samples per second (GSPS). ADCs 106, 108, 110 and 112 operate under the control of clock divider 116. Differential clock inputs CLKP 118 and CLKM 120 drive clock divider 116. To provide 3 GSPS throughput, ADCs 106, 108, 110 and 112 sample the input signal serially, one at a time. Buffers 102 and 104 insure that each of ADCs 106, 108, 110 and 112 has the appropriate input when necessary. That is, buffers 102 and 104 along with clock divider 116 cause ADCs 106, 108, 110 and 112 to provide an interleaved output signal with a combined sampling rate of 3 GSPS. Digital estimation and correction block 114 combines the outputs of ADCs 106, 108, 110 and 112 as a single output. The use of four ADCs is an example. The number of interleaved ADCs is only limited by practical considerations of implementation.

However, it is very difficult to make four ADCs with the same response characteristics. One ADC may have a gain of x at a frequency and the next ADC may have a gain of x*1.02 at that frequency. Even small mismatches create frequency spurs in the overall ADC output that can cause significant performance problems in downstream processing of that output.

Figure 2:
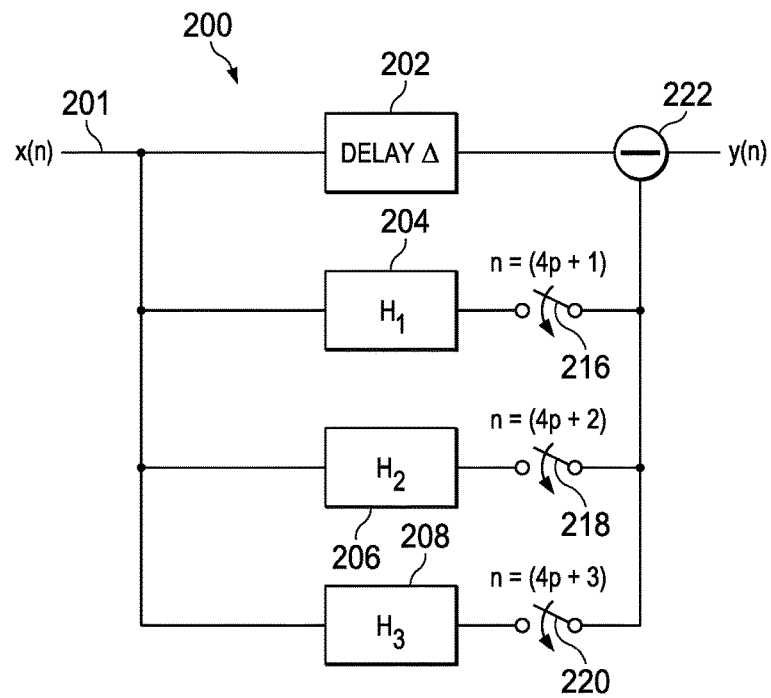
FIG. 2 is a schematic diagram of a linear correction circuit that corrects for mismatches in the response of interleaved ADCs.

FIG. 2 is a schematic diagram of an interleaving mismatch correction circuit 200 that corrects for mismatches in the response of interleaved ADCs, such as ADCs 106, 108, 110 and 112 (FIG. 1). Circuit 200 can be implemented in hardware or software. In an example, digital estimation and correction block 114 (FIG. 1) is an integrated circuit that includes circuit 200 implemented in hardware. ADC output x(n) 201 is the combined, interleaved output of ADCs 106, 108, 110 and 112 (FIG. 1). Delay unit 202 and linear combiners 204, 206 and 208 receive ADC output x(n) 201. One ADC, for example ADC 106 (FIG. 1), is a reference ADC. The output of this ADC passes through circuit 200 uncorrected. Delay unit 202 is a tapped delay line that delays this output to align it in time with the output of the other ADCs because of the delays caused by linear combiners 204, 206 and 208.

Linear combiners 204, 206 and 208, in this example, are multi-tap finite impulse response (FIR) filters. For example, linear combiner 204 may provide correction for ADC 108 (FIG. 1), linear combiner 206 may provide correction for ADC 110 (FIG. 1), and linear combiner 208 may provide correction for ADC 112 (FIG. 1).

Switches 216, 218 and 220 coordinate so that the output of linear combiners 204, 206 and 208 arrive at subtraction unit 222 at the same time as the ADC output for the corresponding ADC. The output of linear combiners 204, 206 and 208 is a correction factor for the output of ADCs 108, 110 and 112 (FIG. 1), respectively. The respective correction factor arrives at subtraction unit 222 at the same time as the output of the respective ADC and corrects for the mismatch between that ADC and the reference ADC.

Figure 3:
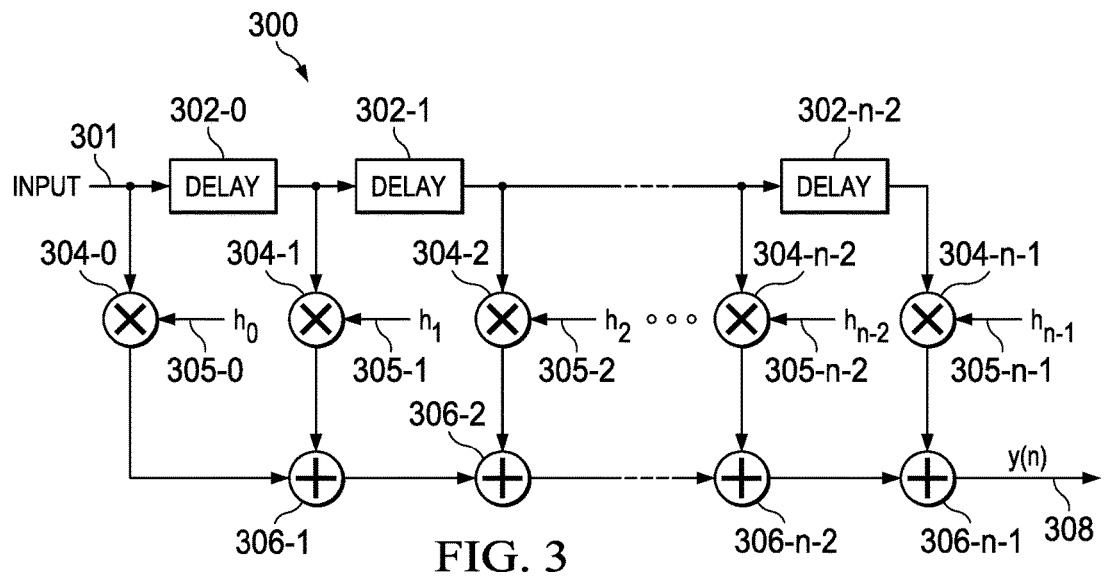
FIG. 3 is a schematic diagram of a finite impulse response (FIR) filter.

FIG. 3 is a schematic diagram of a finite impulse response (FIR) filter 300. An FIR filter is one example of a linear combiner. As noted hereinabove, linear combiners 204, 206 and 208 (FIG. 2) may be FIR filters. Input 301 corresponds to the input to one of linear combiners 204, 206 and 208 (FIG. 2). Operator circuits, such as delay unit 302-0 and multiplier 304-0 receive input 301. Delay unit 302-1 and multiplier 304-1 receive the output of delay unit 302-0. This pattern repeats until only multiplier 304-n−1 receives the output of delay unit 302-n−2. The integer n is the number of weighting factors or taps in the filter. Multipliers 304-0 through 304-n−1 multiply the respective inputs with taps 305-0 through 305-n−1, respectively. A tap is a number selected to provide the desired filter response according to FIR filter theory. Adders 306-1 through 306-n−1 add the outputs of multipliers 304-0 through 304-n−1 to provide correction output 308.

Figure 4:
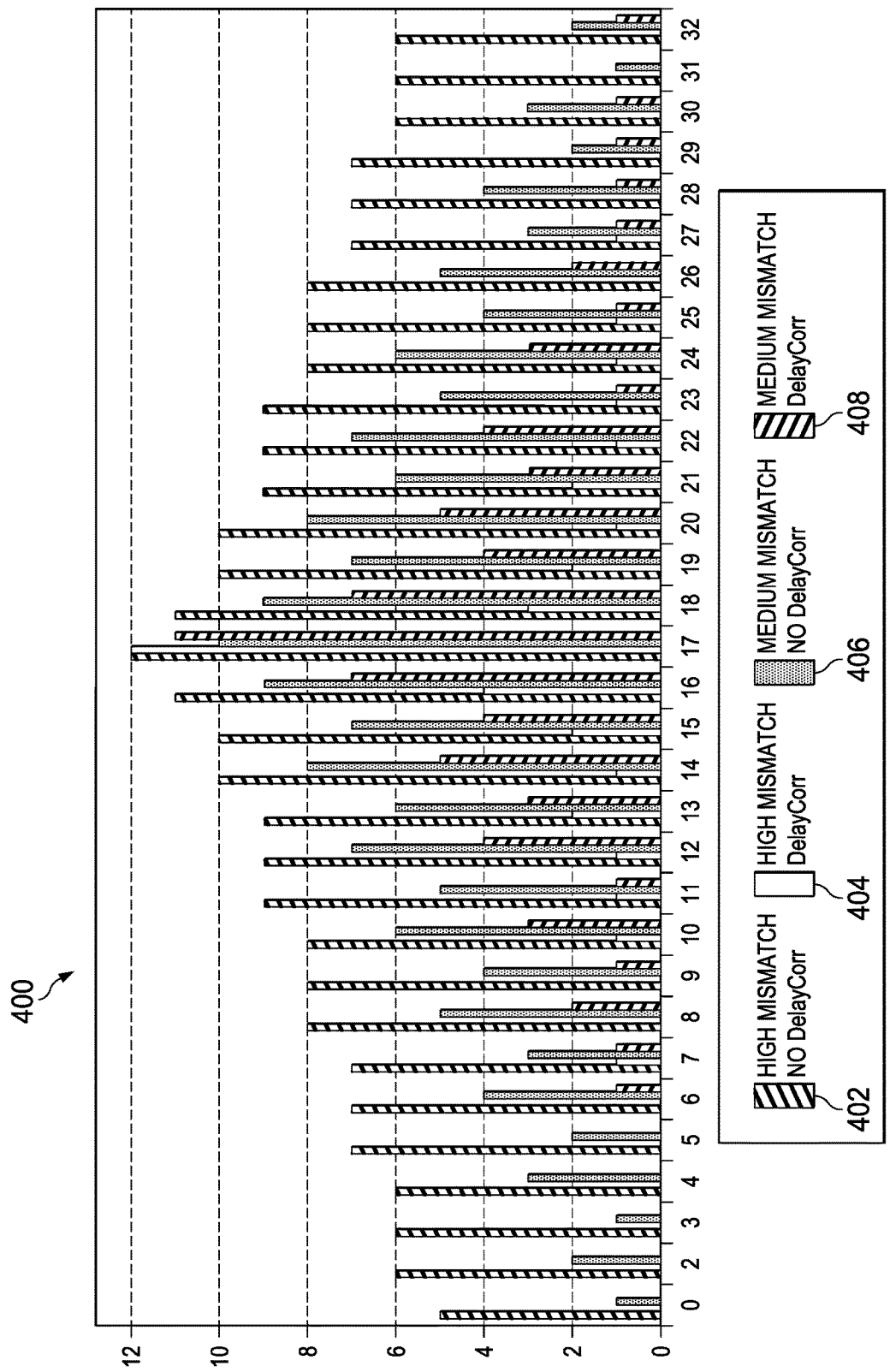
FIG. 4 is a graph showing four example sets of weighting factors.

FIG. 4 is a graph showing the bit size (i.e., the bit width needed to design a filter) for four example sets of weighting factors or taps like taps 305-0 through 305-n−1 ($h_0$ through $h_{n-1}$) (FIG. 3). In this example, the weighting factors are filter taps. Filter 402 is for a high ADC mismatch with no delay correction. Filter 404 is for a high ADC mismatch with delay correction. Filter 406 is for a medium ADC mismatch with no delay correction. Filter 408 is for a medium ADC mismatch with delay correction. Graph 400 shows that each of the filter tap sets includes, in this example, 32 filter taps. The vertical axis of graph 400 indicates the number of bits needed to represent the filter tap. Graph 400 shows that the number of bits needed for various taps has a great variation from less than two to twelve. Each one of the taps illustrated in graph 400 corresponds to a multiplier in FIR 300 (FIG. 3). Each correction circuit 200 (FIG. 2) includes three filters, such as linear combiners 204, 206 and 208 (FIG. 2). Therefore, the described examples include 3*32=96 multipliers. A worst case bit width of 12-bits per tap may be used to implement the filters. In such a case, each multiplier multiplies a 12-bit tap with a 9-bit ADC input, and thus is a 12×9 multiplier. Each of these multipliers performs a multiplication every 1/750 MHz=1.34 nS. This consumes a very large amount power.

Figure 5:
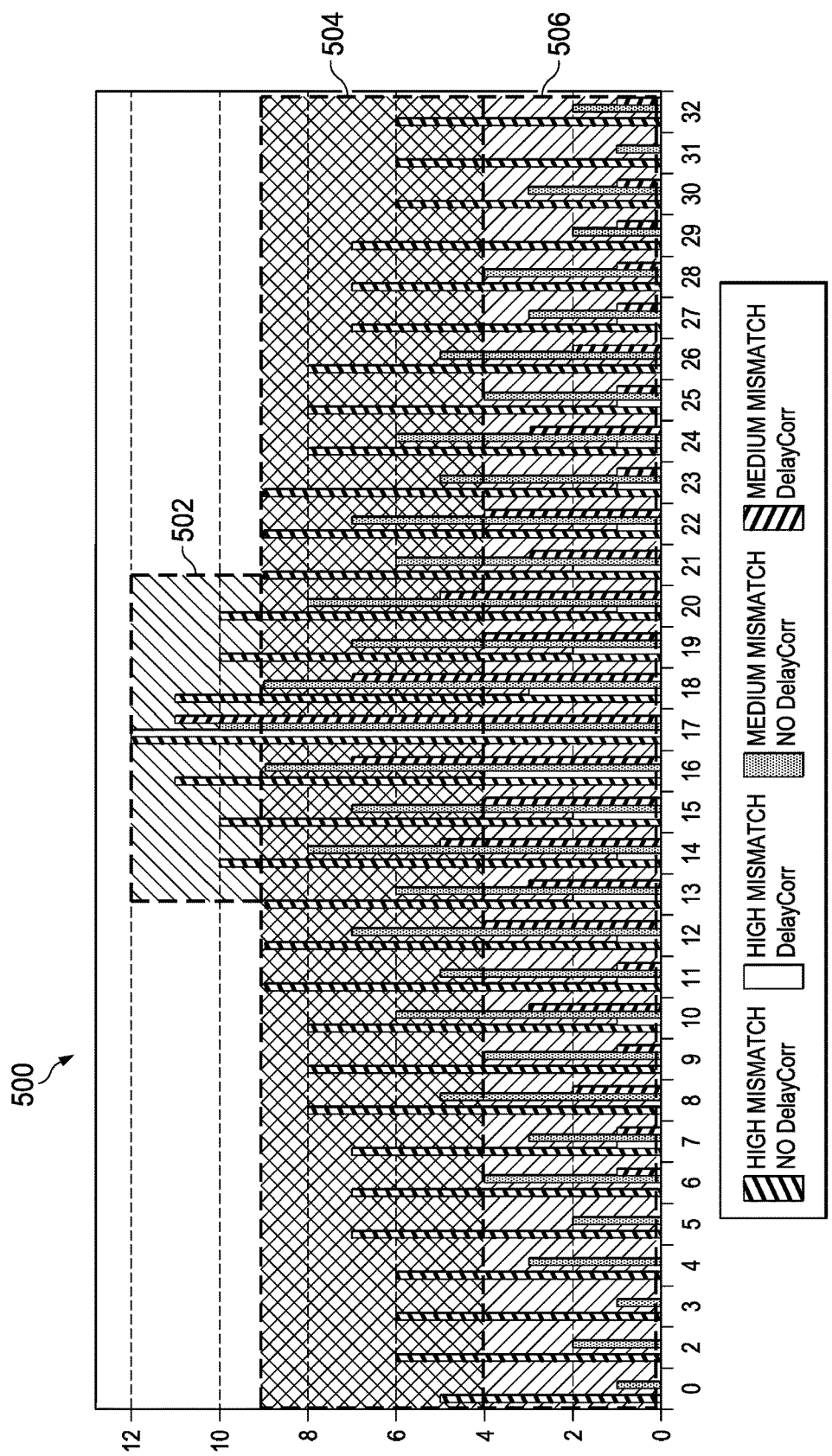
FIG. 5 is a graph of an example weighting factor configuration.

FIG. 5 is a graph 500 of an example weight factor or tap configuration. The taps shown in graph 500 are similar to the taps shown in graph 400. Each tap or weight is divided into sub-weights according to the number of bits in the tiles. High tile 502 includes the most significant bits 9-11 of the taps. Medium tile 504 includes bits 4-8 of the taps. Low tile 506 includes bits 0-3 of the taps. The tiles are not simply the respective bits. Binary numbers are usually represented in complex configurations such as 2's complement to allow for simpler and/or faster circuitry to perform mathematical functions. With such complex binary number configurations, simply removing the medium and low bits from taps may separate those bits from the sign bit(s) and change the numeric value of those groups of bits.

Therefore, the sub-weights in tiles 502, 504 and 506 must be determined in a manner that preserves the overall value of the weight (tap). In one example, the medium and low tile sub-weights may be the corresponding bits with an added sign bit to preserve their value. In another example, a rounding procedure accounts for the sign while preserving the overall value of the weight without the need to add additional sign bits. To explain this example, assume that the weight h is the binary number 010100011001, which is expressed in 2's complement format. Converting the weight to sub-weights in this example uses the following scaled, rounding-based decomposition procedure.

First, the eight most significant bits of the weight h are removed to produce the low tile weight $h_L$. This is expressed mathematically in Equation 1:

$$h_L = h \& 0xF \tag{1}$$

Where, & represents the Boolean AND function and 0xF is the hexadecimal representation of the binary number 000000001111. That is, 0xF has zeros in the bit positions to be removed and ones in the bit positions to be preserved.

Second, the weight h is truncated to a weight $h_{HM}$ including the high and medium bits and where the least significant bit of $h_{HM}$ is rounded. That is, if the most significant bit of $h_L$ is one, a one is added in the least significant bit position of $h_{HM}$. Using the above example weight, h is 010100011001, the bottom four bits are removed, which truncates to 01010001. Because the most significant bit of $h_L$ is 1, rounding adds a one in the least significant bit position to yield 01010010. This is expressed mathematically in Equation 2:

$$h_{HM} = \text{round}(h, 4) \tag{2}$$

In this case, the number of bits rounded is four.

In this example, $h_L$ is 1001. In 2's complement notation, that is −7. However, these bits represent 9 in weight h. To correct for this, a one in the least significant bit position of $h_{HM}$ ($2^4$) is added by rounding. That is, 16 is added to $h_{HM}$. The added 16 compensates for the change in value of the $h_L$ because of the 2's complement format. That is, 16 added to negative 7 equals the original value of 9. Thus, the rounding operation preserves the original value without the need to add an additional sign bit to $h_L$. If the leading bit of $h_L$ is zero, the original value of the low tile bits and the 2's complement representation are the same. Therefore, whether the most significant bit of $h_L$ is 0 or 1, the four bits of $h_L$ can be used as a 2's complement number without the need to add a sign bit or any other alteration.

Third, the medium tile sub-weight $h_M$ is determined by removing the three most significant bits of $h_{HM}$. This is expressed mathematically in Equation 3:

$$h_M = h_{HM} \& 0x1F \tag{3}$$

Where 0x1F is the hexadecimal representation of 31 or 00011111

Fourth, the high tile sub-weight $h_H$ is determined by rounding $h_{HM}$ to the high tile bits. In this example, the lower five bits of $h_{HM}$ are rounded off. This is expressed mathematically in Equation 4:

$$h_H = \text{rounded}(h_{HM}, 5) \quad (4)$$

In the above example, $h_{HM}$ is 01010010, which is truncated to 010. The most significant bit of $h_M$ is one, so a one is added in the least significant bit position of $h_H$ to yield $h_H$=011. As with the low tile sub-weight, the rounding of $h_H$ allows $h_M$ to be used as a 2's complement number without alteration (that is, no added sign bit is necessary).

These numbers added together provide the correct weight or tap. This provides the correct result because of the distributive property of linear functions. In this case, this can be expressed as Equation 5 and 6:

$$h = (h_H * 2^{(b_M + b_L)} + h_M * 2^{(b_L)} + h_L) \quad (5)$$

Where $b_M$ is the number of bits in $h_M$ and $b_L$ is the number of bits in $h_L$. Therefore, $$hx(n) = (h_H * 2^{(b_M + b_L)} + h_M * 2^{(b_L)} + h_L)x(n) = h_H * 2^{(b_M + b_L)}x(n) + (h_M * 2^{(b_L)})x(n) + h_L x(n) \quad (6)$$

Where x(n) is the input digital signal from the ADCs.

Figure 6:
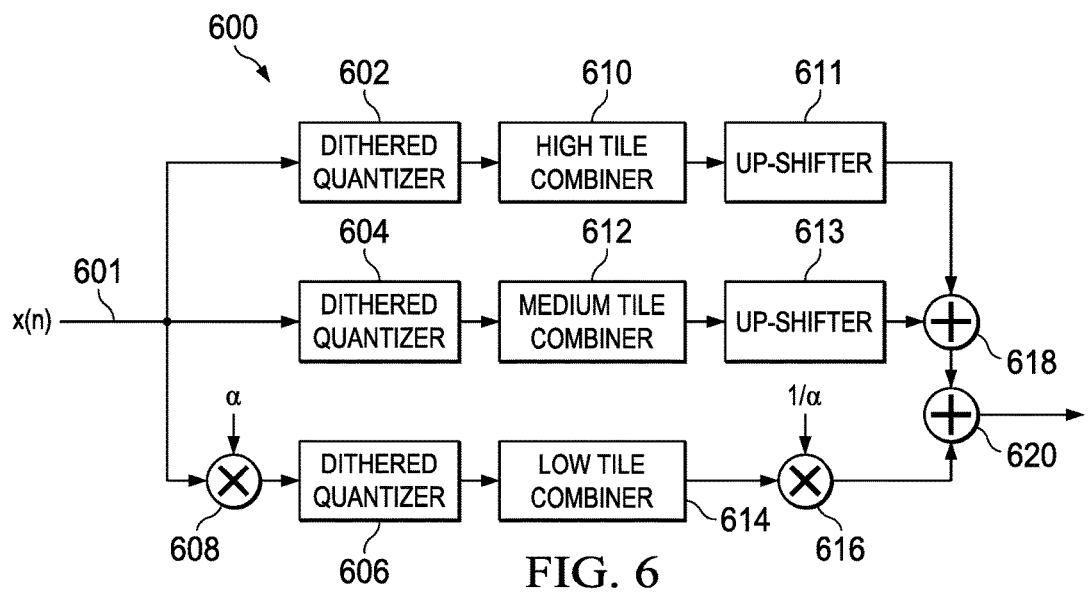
FIG. 6 is a block diagram of an example linear combiner.

FIG. 6 is a block diagram of an example linear combiner 600. Linear combiner 600 may have all or a portion of its components in an integrated circuit or multiple integrated circuits in a hybrid package. In addition, a processor such as a digital signal processor may implement all or a portion of the components of linear combiner 600. Linear combiner 600 performs a function like one of linear combiners 204, 206 or 208 (FIG. 2). Dithered quantizer 602 receives ADC output x(n) 601. As noted hereinabove regarding FIG. 2, ADC output x(n) 601 may be, for example, 15 bits. Dithered quantizer 602 quantizes ADC output x(n) 601 to a lower precision by truncating it to a lower number bits, for example, truncating the lower 6 bits of ADC output x(n) 601. Therefore, the output of dithered quantizer 602 is the 9 most significant bits of ADC output x(n) 601. Mathematics, simulations and/or experimentation determine the allowable level of truncation that avoids the addition of significant noise to the final output.

High tile combiner 610 is, in this example, a finite impulse response (FIR) filter like FIR 300 (FIG. 3). However, the taps that are applied to high tile combiner 610 are the sub-weights of high tiles 502 (FIG. 5). Therefore, each multiplication in high tile combiner 610 is a nine-bit input times a three-bit high tile filter quantity. The multipliers 304-1 through 304-1 (FIG. 3) are 9-bit (input)×12 (coefficient) multipliers whose complexity is proportional to 9×12=108. Finally, up-shifter 611 shifts the output of high tile combiner 610 higher the number of bits in the corresponding the bit size of medium tile 504 (FIG. 5) and low tile 506 (FIG. 5) to provide a high tile correction output. In this example, the taps of high tile 502 (FIG. 5) implicitly include eight zero bits. Therefore, up-shifter 611 shifts the output of high tile combiner 610 eight bits.

Graph 500 (FIG. 5) shows that most of high tiles 502 (FIG. 5) are zero. That is, the tap from which high tiles 502 (FIG. 5) is derived has a value lower than $2^8$, in this example. In some examples, when the multipliers of high tile combiner 610 (like the multipliers in the FIR filter of high tile combiner 610 that correspond to multipliers 304-0 through 304-n-1 FIG. 3) have a tile input of zero, high tile combiner 610 provides a multiplier output of zero and blocks the clock signals driving that multiplier so that multiplier does not operate. Even multiplying by zero can consume considerable energy. By blocking the clock of the multipliers that are multiplying zero saves significant power with no impact on the quality of the filter output.

Dithered quantizer 604 quantizes ADC output x(n) 601 to a lower precision by truncating the lower bits of ADC output x(n) 601 by, for example, 9 bits, three bits more than dithered quantizer 602. The taps in medium tile 504 (FIG. 5) represent the values of bits 5-8 of the full tap and feed medium tile combiner 612. The larger truncation by dithered quantizer 604 does not cause intolerable levels of noise as opposed to the smaller truncation of dithered quantizer 602, because up-shifter 613 shifts the output of medium tile combiner 612 by five fewer bits. Therefore, the output of up-shifter 613 is a smaller number and less significant in the final outcome. Medium tile combiner 612 includes an FIR filter like FIR filter 300 (FIG. 3). As with high tile combiner 610, the combination of the tiled sub-weights and the truncated input of dithered quantizer 604 allows for smaller 5×6 multipliers in the FIR of medium tile combiner 612. The output of up-shifter 613 is a medium tile correction output that is added to the output of up-shifter 611 by adder 618. As with high tile combiner 610, for any tile that is zero, medium tile combiner 612 may, in some examples, provide a zero multiplier output and block the operation of that multiplier.

Multiplier 608 scales and multiplies ADC output x(n) 601 by a factor α. Dithered quantizer 606 receives the output of multiplier 608 and provides the top three bits of the α adjusted ADC output x(n) 601 to low tile combiner 614. The a factor is a number less than one, for example, 0.75. Dithered quantizer 606 quantizes ADC output x(n) 601 to a lower precision by truncating the lower bits of ADC output x(n) 601 by, for example, 12 bits, three bits more than dithered quantizer 604. The multiplication by a is done to ensure that the heavy truncation of the input does not cause saturation. For example, if the input is 0.9 of the full scale of the input, quantizing such an input to only the 3 most significant bits results in saturation of the input. Due to this saturation, a spur arises at the output. To avoid such a spur, the input is scaled. In this example, multiplying 0.9 by 0.75 makes the input small enough so as to not be saturated. The sub-weights in low tile 506 (FIG. 5) represent the values of bits 1-4 of the full tap and feed low tile combiner 614. As with the medium tile branch, the larger truncation by dithered quantizer 606 does not cause intolerable levels of noise as opposed to the smaller truncation of dithered quantizers 602 and 604, because the output of low tile combiner 614 is not up-shifted. Therefore, the output of low tile combiner 614 is a smaller number and less significant in the final sum. Low tile combiner 614 includes an FIR filter like FIR filter 300 (FIG. 3). As with high tile combiner 610 and medium tile combiner 612, the combination of the tiled taps and the truncated input of dithered quantizer 604 allows for smaller 4×4 multipliers in the FIR of low tile combiner 614. Multiplier 616 operates as a descaler and multiplies the output of low tile combiner 614 with the inverse of α to compensate for the initial multiplication by α and provide a low tile correction output.

Adder 620 adds the output of multiplier 616 to the output of adder 618 to provide a combined correction output. The combined correction factor combines with the delayed ADC output x(n) 601 in a similar manner to one of combiners 204, 206 or 208 to correct delayed ADC output x(n) 601. The combiners of FIG. 6 have 9×3 multipliers for the high tile (high tile combiner 610), 6×5 multipliers for medium tile (medium tile combiner 612) and 3×4 multipliers for low tile (low tile combiner 614). Thus, the overall complexity is 9×3+6×5+3×4=27+30+12=69, which is about 35% lower in complexity than the original corrector (69 compared with 108).

Figure 7:
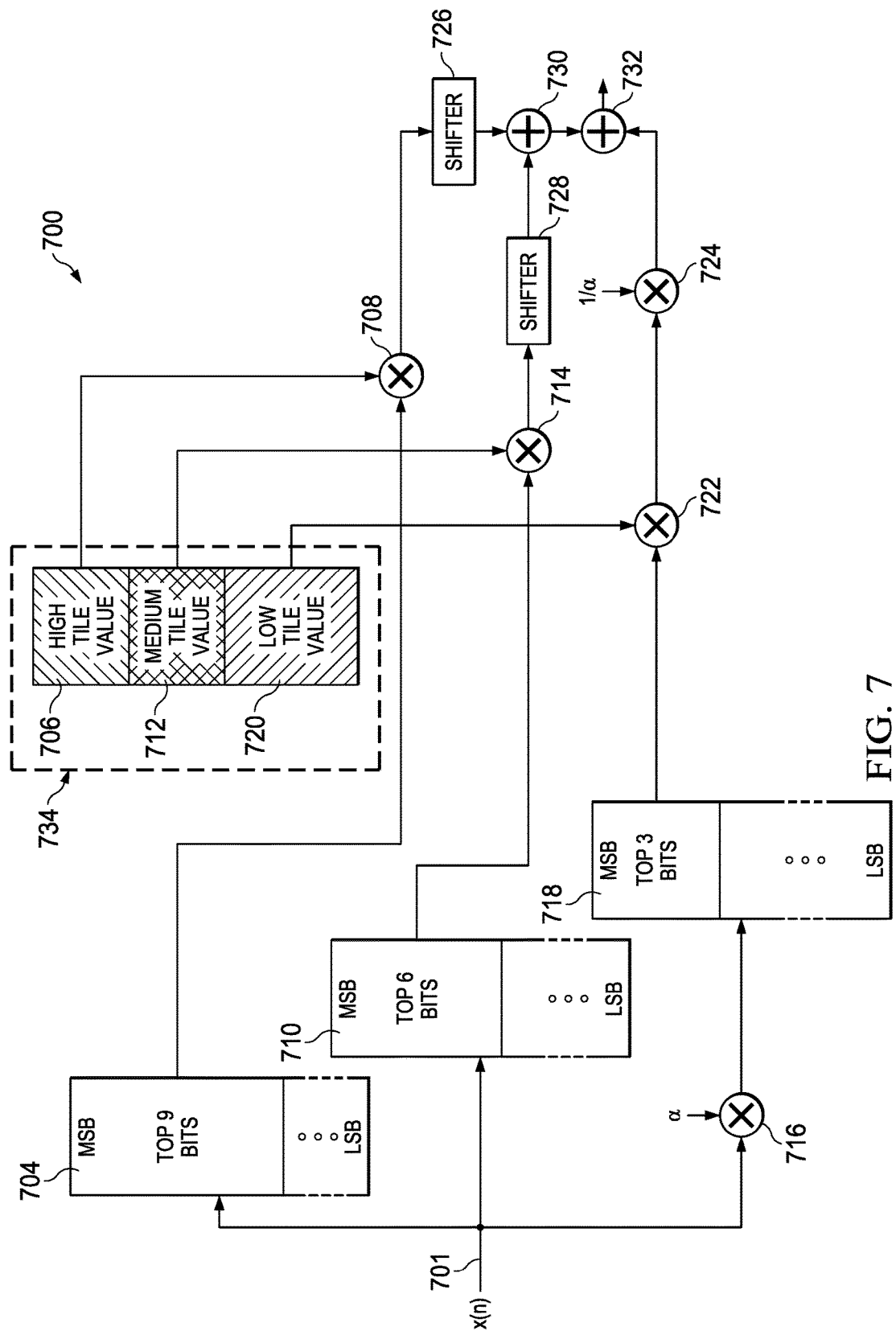
FIG. 7 is a schematic diagram showing a data flow through a linear combiner.

FIG. 7 is a schematic diagram 700 showing a data flow through a linear combiner like linear combiner 600 (FIG. 6). For a high tile flow, dithered quantizer 602 (FIG. 6) quantizes ADC output x(n) 701 to a lower precision of nine bits, for example by truncating the lower bits of ADC output x(n) 701 to truncated output 704. Multiplier 708 multiplies truncated output 704 by high tile sub-weight 706. For the medium tile flow, dithered quantizer 604 (FIG. 6) quantizes ADC output x(n) 701 to a lower precision of six bits, for example, by truncating the lower bits of ADC output x(n) 701 to provide truncated output 710. Multiplier 714 multiplies truncated output 710 by medium tile sub-weight 712. For the low tile flow, multiplier 716 multiplies ADC output x(n) 701 by α. Dithered quantizer 606 (FIG. 6) quantizes ADC output x(n) 701 to a lower precision of three bits, for example, by truncating the output of multiplier 716 to three bits to truncated output 718. Multiplier 722 multiplies truncated output 718 by low tile sub-weight 720. In some examples, high tile sub-weight 706 may be 3 bits, medium tile sub-weight 712 may be 5 bits, and low tile sub-weight 720 may be 4 bits.

Shifter 726 shifts the output of multiplier 708 to compensate the bit positions below high tile sub-weight 706 that are part of the full tap 734. Shifter 728 shifts the output of multiplier 714 to compensate for bit positions below medium tile sub-weight 712 that are part of the full tap 734. Adder 730 adds the outputs of shifters 726 and 728. Multiplier 724 multiplies the output of multiplier 722 by the inverse of α, and adder 732 adds the output of multiplier 724 to the output of adder 730. The output of adder 732 is the correction factor applied to the ADC output stream as further explained below.

FIG. 7 is a simplification for clarity. In an actual example using an FIR filter, linear combiner 600 (FIG. 6) applies, as in the example of graph 500 (FIG. 5), thirty-two taps 734 to thirty-two multipliers for each of multipliers 708, 714 and 722 in the configuration of, for example, multipliers 304-0 through 304-n−1, where n=32. That is, each of multipliers 708, 714 and 722 represent thirty-two multipliers (or a smaller number of multipliers used repeatedly to provide thirty-two multiplications). Each of the high tile combiner 610, medium tile combiner 612 and low tile combiner 614 (FIG. 6) applies the tiles of taps like taps 305-0 through 305-n−1 ($h_0$ through $h_{n-1}$). FIG. 7 does not show delay units 302-0 through 302-n−2 and adders 306-1 through 306-n−1 (FIG. 3). However, in the example configuration, each of the high tile combiner 610, medium tile combiner 612 and low tile combiner 614 (FIG. 6) includes the elements as shown in FIG. 3.

Figure 8:
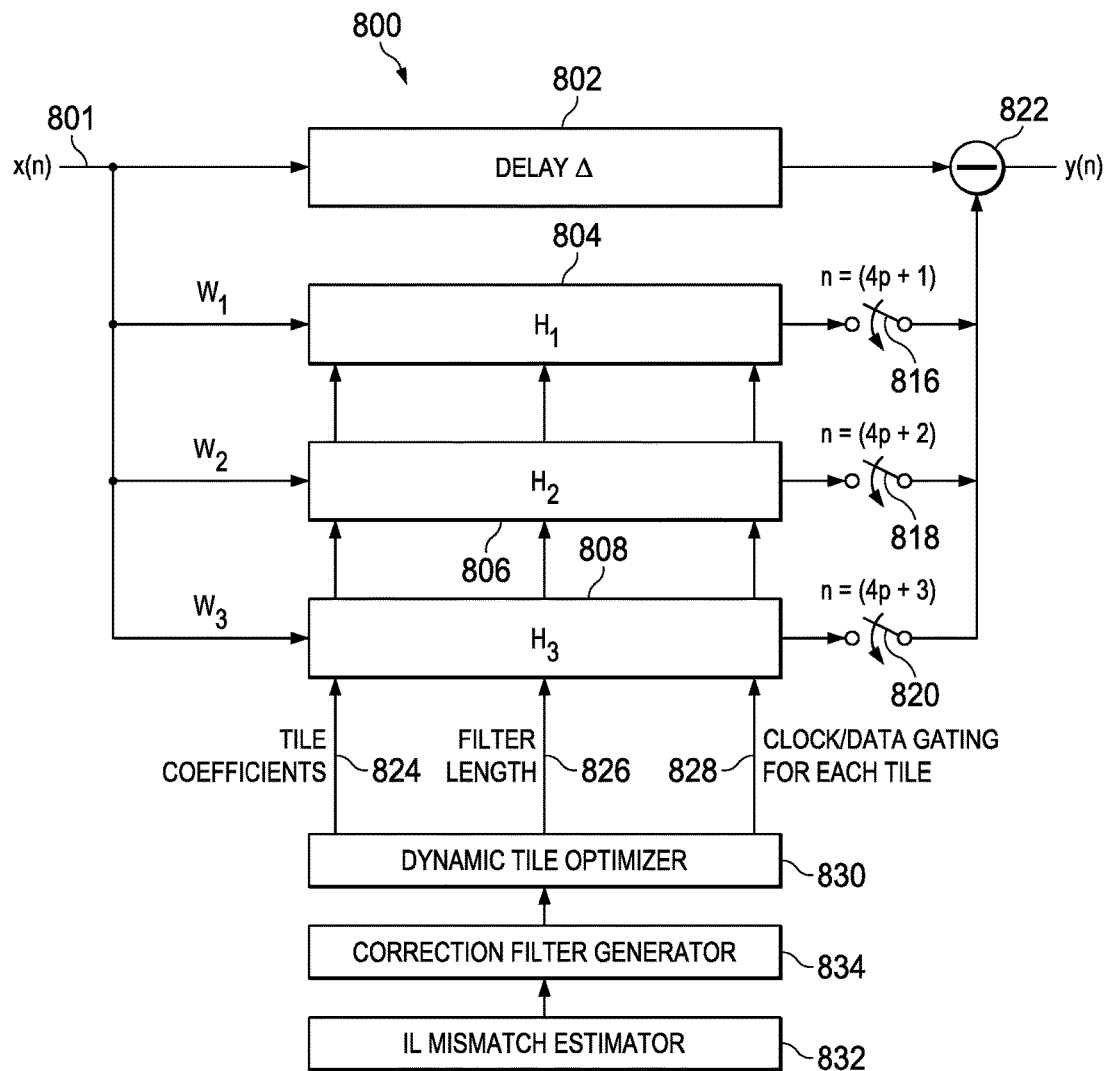
FIG. 8 is a block diagram of an example ADC interleaving corrector.

FIG. 8 is a block diagram of an example ADC interleaving corrector 800. ADC interleaving corrector 800 may have all or a portion of its components in an integrated circuit or multiple integrated circuits in a hybrid package. In addition, a processor, such as a digital signal processor may implement all or a portion of the components of ADC interleaving corrector 800. ADC output x(n) 801 includes the output of four interleaved ADCs like ADCs 106, 108, 110 and 112 (FIG. 1). As noted herein above, the output of one of the ADCs is a reference output. After the delay of delay unit 802, this output arrives at subtractor 822 at time 4p, where p is a sample index from the ADCs (ADCs 106, 108, 110 and 112 of FIG. 1). At 4p+1, the output of the next ADC (for example, ADC 108 (FIG. 1)) arrives at subtractor 822. At 4p+1, switch 816 closes. Thus, linear combiner 804 applies a correction factor to subtractor 822 to adjust the output of ADC 108 (FIG. 1). At 4p+2, the output of the next ADC (for example, ADC 110 (FIG. 1)) arrives at subtractor 822. At 4p+2, switch 818 closes. Thus, linear combiner 806 applies a correction factor to subtractor 822 to adjust the output of ADC 110 (FIG. 1). At 4p+3, the output of the next ADC (for example, ADC 112 (FIG. 1)) arrives at subtractor 822. At 4p+3, switch 820 closes. Thus, linear combiner 808 applies a correction factor to subtractor 822 to adjust the output of ADC 112 (FIG. 1). The cycle then repeats.

Linear combiners 804, 806 and 808 include, in this example, three-tile combiners like linear combiner 600 (FIG. 6). Interleave (IL) mismatch estimator 832 estimates the mismatches between ADCs based on experimental data, on-chip estimation, simulations, and the frequency, amplitude and other characteristics of ADC output x(n) 801. Correction filter generator 834 generates filter characteristics (number of taps, tap amplitude, etc.) and provides this data to dynamic tile optimizer 830. Dynamic tile optimizer 830 generates sub-weights 824 (like sub-weights of high tiles 502, medium tiles 504 and low tiles 506 (FIG. 5)), filter length 826 and clock/data gating 828 from the output of correction filter generator and provides that data to linear combiners 804, 806 and 808.

Figure 9:
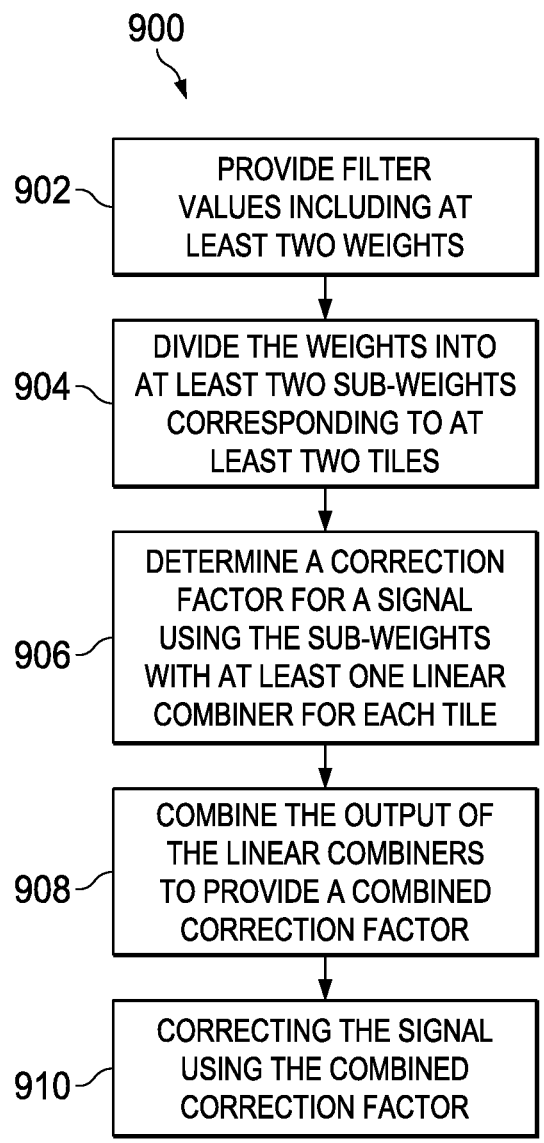
FIG. 9 is a flowchart of an example method.

FIG. 9 is a flowchart of an example method 900. Step 902 provides filter values including at least two weights or taps. For example, FIG. 4 shows four filters 402, 404, 406 and 408, where each filter includes thirty-two taps. Step 904 divides the taps into at least sub-weights corresponding to two tiles. For example, FIG. 5 shows the weights of FIG. 4 divided into three tiles 502, 504 and 506. Step 906 applies the sub-weights using a linear combiner for each tile to determine a correction factor output for a signal. For example, linear combiner 600 includes high tile combiner 610, medium tile combiner 612 and low tile combiner 614 (FIG. 6) to apply the sub-weights of high tile 502, medium tile 504 and low tile 506 (FIG. 5), respectively, to determine a correction factor output for each tile. Step 908 combines the correction factor outputs determined in step 906 to provide a combined correction factor output. For example, adders 618 and 620 combine the outputs of high tile combiner 610 as shifted by up-shifter 611, medium tile combiner 612 as shifted by up-shifter 613, and low tile combiner as descaled by multiplier 616. Step 910 corrects the signal using the combined correction factor output by adding or subtracting the correction factor as described regarding subtractor 822 (FIG. 8).

Figure 10:
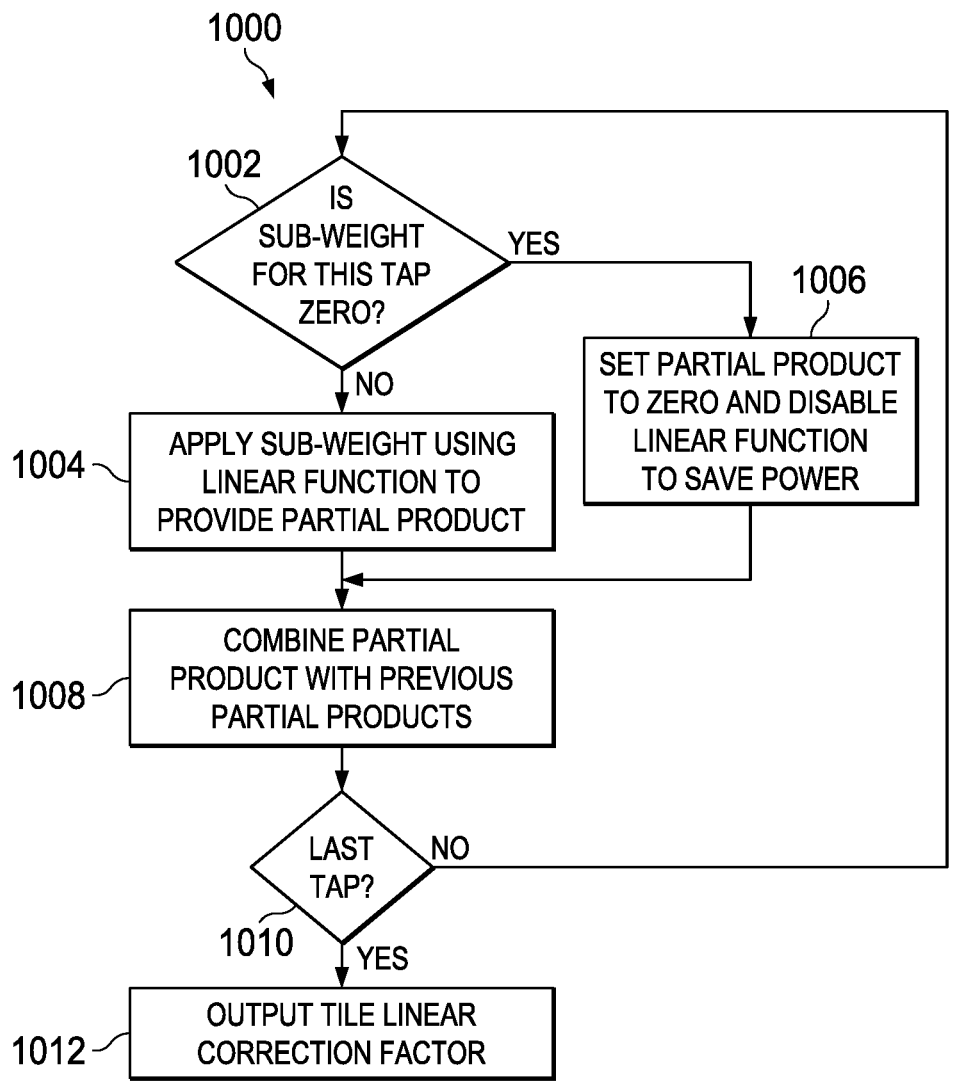
FIG. 10 is an example method for performing a step of the method of FIG. 9.

FIG. 10 is an example method 1000 for performing step 906 of method 900 (FIG. 9). Step 1002 determines if the sub-weight of the current tap in the currently operating tile is zero. If not, step 1004 uses the sub-weight to determine a partial product. For example, the output of one of multipliers 304-0 through 304-n−1 (FIG. 3) is a partial product. If the sub-weight for the current tap is zero, step 1006 sets the partial product to zero and disables the linear function (for example, one of multipliers 304-0 through 304-n−1 FIG. 3) to save power. For example, if one of the sub-weights in high tiles 502 (FIG. 5) is zero, the corresponding one of multipliers 304-0 through 304-n−1 (FIG. 3) is disabled to save power. If all of the sub-weights in a tile are zero, then all of the multipliers for that tile are disabled. Step 1008 combines the partial product determined in either step 1004 or step 1006 with previous partial products. Step 1010 determines if the current tap is the last tap. If not, the method loops back to step 1002. If it is the last tap, step 1012 outputs the combined partial products as the linear correction factor for the tile.

Modifications are possible in the described examples, and other examples are possible, within the scope of the claims. For example, although examples described herein employ finite impulse response filters, other examples may use other types of filters or other types of linear combiners.

What is claimed is:

1. An integrated circuit including a linear combiner, comprising:
   an input operable to receiving a signal;
   a plurality of operator circuits operable to apply weighting factors to the signal, in which a first operator circuit in the plurality of operator circuits performs a first operation on the signal using a first sub-weight of one of the weighting factors to provide a first tile output and a second operator circuit in the plurality of operator circuits performs a second operation on the signal using a second sub-weight of the one of the weighting factors to provide a second tile output;
   an adder having a first input coupled to receive the first tile output and the second tile output and providing a combined output; and
   a scaler coupled between the input and the second operator circuit and a descaler coupled to an output of the second operator circuit.

2. The integrated circuit of claim 1 in which the first sub-weight and second sub-weight are computed from bits of the one of the weighting factors.

3. The integrated circuit of claim 1 in which the operator circuits are multipliers.

4. The integrated circuit of claim 1 in which the first tile output is shifted upwards by a number of bits corresponding to bits in the second sub-weight.

5. The integrated circuit of claim 1 in which the linear combiner is a filter.

6. The integrated circuit of claim 1 in which the first operator circuit is disabled when the first sub-weight is zero.

7. The integrated circuit of claim 1 in which the one of the weighting factors is in 2's complement format and the second sub-weight is a first number of least significant bits and the first sub-weight is a second number of bits beginning with a next most significant bit after the first number of least significant bits that is rounded depending on a value of a most significant bit of the first number of least significant bits.

8. The integrated circuit of claim 1 in which the plurality of operator circuits includes a third operator circuit in the plurality of operator circuits that performs a third operation on the signal using a third sub-weight of the one of the weighting factors.

9. The integrated circuit of claim 1 in which the signal is quantized to a lower precision for the first operation on the signal.

10. An apparatus, comprising:
    an input operable to receive a signal;
    a plurality of linear combiners operable to apply weighting factors to the signal, in which a first linear combiner in the plurality of linear combiners performs a first operation on the signal using first sub-weights of the weighting factors to provide a first tile output and a second linear combiner in the plurality of linear combiners performs a second operation on the signal using second sub-weights of the weighting factors to provide a second tile output;
    an adder having a first input coupled to receive the first tile output and second tile output and providing a combined output; and
    a scaler coupled between the input and the second operator circuit and a descaler coupled to an output of the second operator circuit.

11. The apparatus of claim 10 in which the first tile output is shifted upwards by a number of bits corresponding to bits in each of the second sub-weights.

12. The apparatus of claim 10 in which the linear combiner is a filter.

13. The apparatus of claim 10 in which the linear combiner corrects the signal relative to another signal.

14. The apparatus of claim 10 in which the first sub-weights and second sub-weights are computed from bits of the weighting factors.

15. The apparatus of claim 10, in which the plurality of linear combiners are implemented using finite impulse response filters.

16. The apparatus of claim 10 in which multipliers of the first linear combiner are disabled when the first sub-weights are zero.

17. The apparatus of claim 10 in which the plurality of linear combiners includes a third linear combiner in the plurality of linear combiners that performs a third operation on the signal using third sub-weights of the weighting factors.

18. The apparatus of claim 10 in which the weighting factors are in 2's complement format and the second sub-weights are a first number of least significant bits of one of the weighting factors and the first sub-weights are a second number of bits of the one of the weighting factors beginning with a next most significant bit after the first number of least significant bits that is rounded depending on a value of a most significant bit of the first number of least significant bits.

19. The apparatus of claim 10 in which the signal is quantized to a lower precision for the first operation on the signal.

* * * * *